United States Patent
Ahn

[11] Patent Number: 5,302,867
[45] Date of Patent: Apr. 12, 1994

[54] APPARATUS FOR SENSING DATA IN DATA BUS LINES

[75] Inventor: Seung H. Ahn, Suweon, Rep. of Korea

[73] Assignee: Hyundai Electronics Industries Co., Ltd., Kyoungkido, Rep. of Korea

[21] Appl. No.: 846,179

[22] Filed: Mar. 5, 1992

[30] Foreign Application Priority Data

Mar. 6, 1991 [KR] Rep. of Korea ............... 1991-3584

[51] Int. Cl.$^5$ .................. G01R 19/00; G11C 7/00; G11C 7/02; G06G 7/12
[52] U.S. Cl. ............................. 307/530; 307/494; 365/196; 365/207
[58] Field of Search .......... 307/530, 352, 494, 496; 365/208

[56] References Cited

U.S. PATENT DOCUMENTS

| | | | |
|---|---|---|---|
| 4,539,494 | 9/1985 | Kurafuji | 307/530 |
| 4,724,344 | 2/1988 | Watanabe | 307/530 |
| 4,733,112 | 5/1988 | Yamaguchi | 307/530 |
| 4,845,681 | 7/1989 | Vu et al. | 307/530 |

FOREIGN PATENT DOCUMENTS 0020828  2/1978  Japan .................. 307/530

*Primary Examiner*—William L. Sikes
*Assistant Examiner*—Trong Phan
*Attorney, Agent, or Firm*—Darby & Darby

[57] ABSTRACT

This invention comprises a pair of bit lines; a word line; a pair of data bus lines; bit line sense amplifying means connected to said pair of bit lines and said word line; a voltage difference to current difference converter connected to said bit line sense amplifying means through said pair of bit lines, for converting the voltage difference between said pair of bit lines to the current difference; current sensing means connected to said pair of data bus lines and a power source, for sensing a current flowing to said pair of data bus lines and holding a same voltage level in said pair of data bus lines; and current difference to voltage difference converting and amplifying means connected to said current sensing means, for converting the current difference occurred in said current sensing means to the voltage difference and amplifying the voltage difference.

5 Claims, 3 Drawing Sheets

APPARATUS FOR SENSING DATA IN DATA BUS LINES

BACKGROUND OF THE INVENTION

The present invention relates to a data sense circuit, and more particularly to a data sense circuit for sensing data by using current difference in a semiconductor circuit.

The prior art regarding the data sense circuit will be described with reference to FIG. 1 and FIG. 2. As shown in FIG. 1, the data sense circuit of the prior art was composed of the bit line sense amplifying part 1, switching n channel FET's (N2 and N3) connected to the data bus lines (DL1 and DL2), the capacitors (CDB and CDB1), and the data bus line sense amplifier 2. The bit line sense amplifying part was composed of the n channel FET(NL) which the gate thereof was connected to the word line and the source thereof was connected to the bit line (BL1), the bit line sense amplifier 11 connected to between the bit lines (BL1 and BL2), and the capacitors (CBL and CBL1) Connected to the bit lines (BL1 and BL2), and the data bus line sense amplifier 2 was composed of the p channel MOSFET (Pi) which the drain thereof was connected to the gate thereof, the p channel MOSFET (P2) which the source and the gate thereof were connected to the source and the gate of the p channel MOSFET(Pl), the n channel MOSFET's (N4 and N5) which the drains thereof were connected to the drains of the p channel MOSFET's (P1 and P2) and the gates thereof were connected to the drains of the n channel MOSFET's (N2 and N3), and the n channel MOSFET (N6) which the drain thereof was connected to the source of the n channel MOSFET's (N4 and N5).

If the data word line selection signal TWL($\phi0$) is applied to the n channel MOSFET (N1), the voltage difference between the bit lines is caused by the data stored in the memory cell (not shown in FIG. 1). If the sense amplifier 11 is operated by the operating signal ($\phi1$), the voltage difference between the bit lines (BL1 and BL2) is amplified and the switching operating signal ($\phi2$) is applied to the switching MOSFET (N2 and N3) so that this amplified voltage is sent to the data bus lines (DL1 and DL2). Then, changing share is caused by the bit line capacitors (CBL and CBL1) and data line capacitors (CDB and CDB1) and as shown in FIG. 2, the voltage offset occurs. And then according to the operating signal ($\phi3$), the data bus line sense amplifier 2 is operated and outputs the voltage difference.

The data sense circuit of the prior art had problems that the operating time was delayed and power consumption was caused by said charge share in the capacitors, and that the operating time was delayed more because the voltages of the bit lines and the data bus lines were recharged to the same voltage after data sense operation.

SUMMARY OF THE INVENTION

It is an object to provide a data sense circuit which prevents the charge share caused by direct connection between the bit lines and the data bus lines, reduces power consumption caused by charge and discharge of the data bus lines by operating the data bus sense amplifier according to current difference, and holds the same voltage level in the data bus lines.

To achieve said object, this invention comprises a pair of bit lines; a word line; a pair of data bus lines; bit line sense amplifying means connected to said pair of bit lines and said wold line; a voltage difference to current difference converter connected to said bit line sense amplifying means through said pair of bit lines, for converting the voltage difference between said pair of bit lines to the current difference; current sensing means connected to said pair of data bus lines and a power source, for sensing a current flowing through said pair of data bus lines and holding the same voltage level in said pair of data bus lines; and current difference to voltage difference converting and amplifying means connected to said current sensing means, for converting the current difference occupied in said current sensing means to the voltage difference and amplifying the voltage difference.

BRIEF DESCRIPTION OF THE DRAWINGS

The above and other objects, features and other advantages of the present invention will be more cleanly understood from the following detailed description taken in conjunction with the accompanying drawings, in which.

DETAILED DESCRIPTION OF THE PREFERRED EMBODIMENTS

Figure 1:
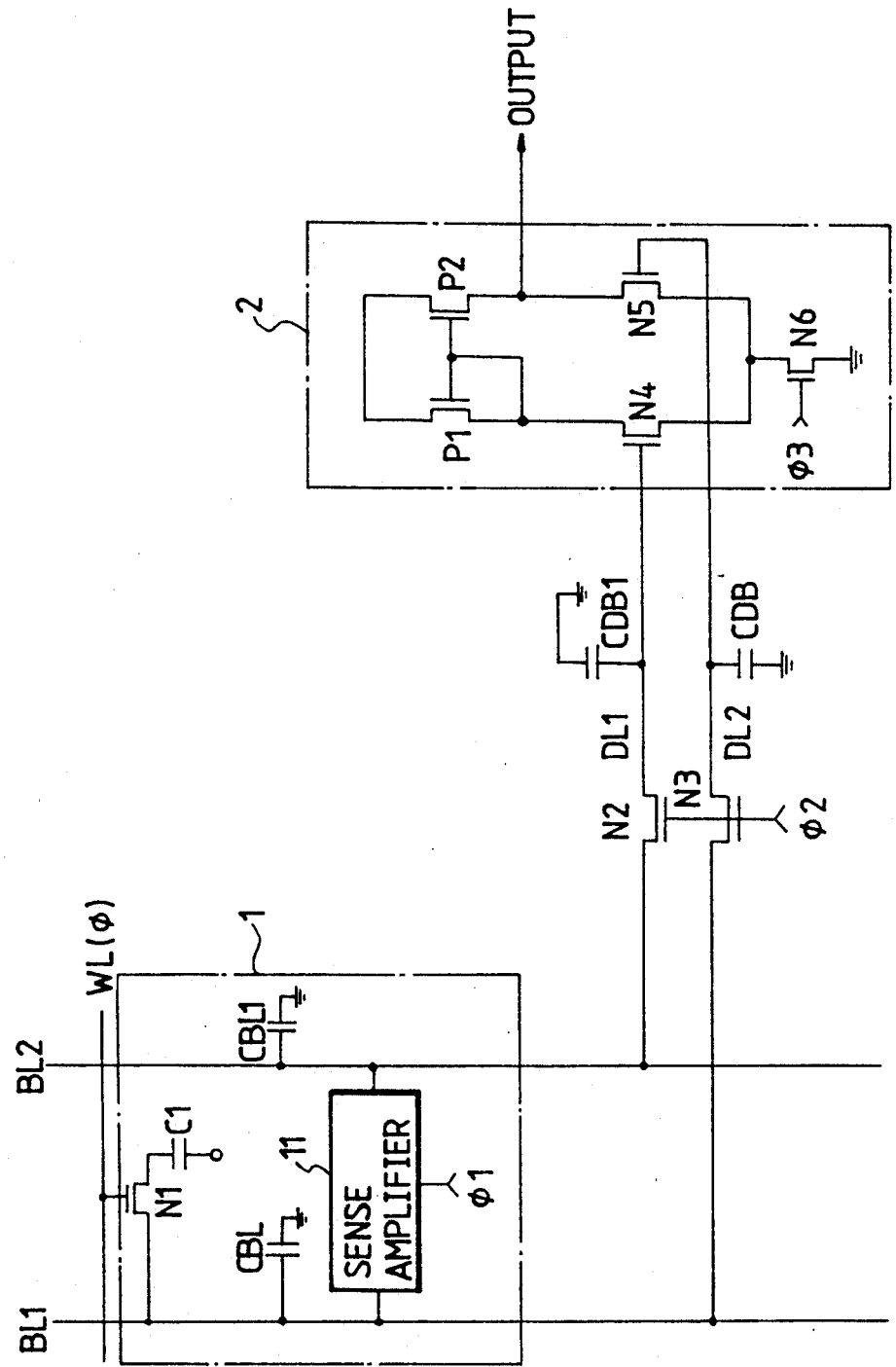
FIG. 1 and FIG. 2 are diagrams for explaining the prior art.
Figure 2:
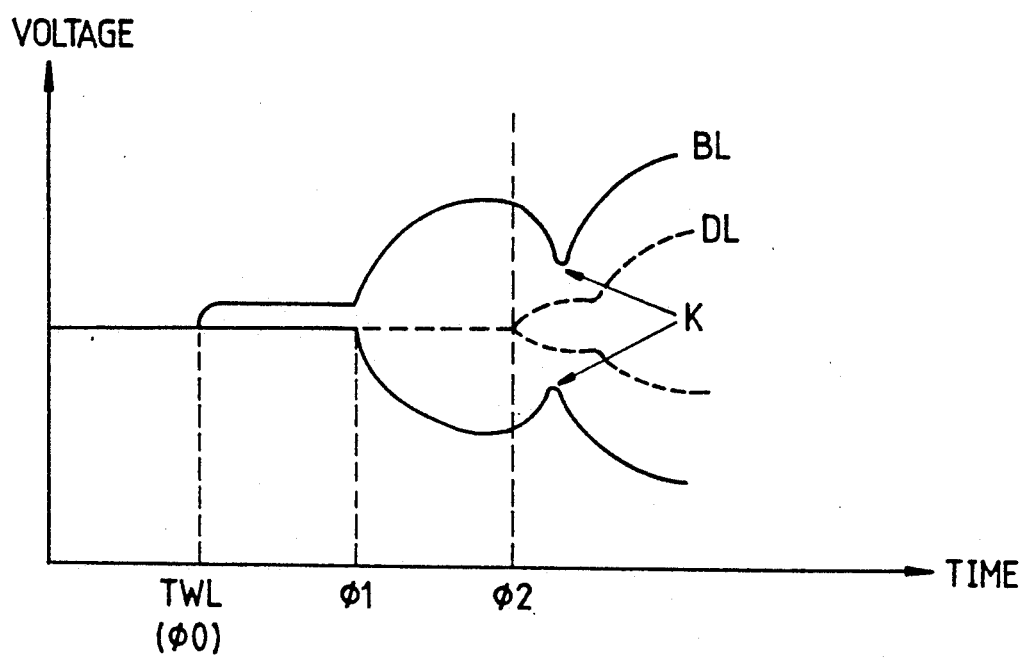
Figure 3:
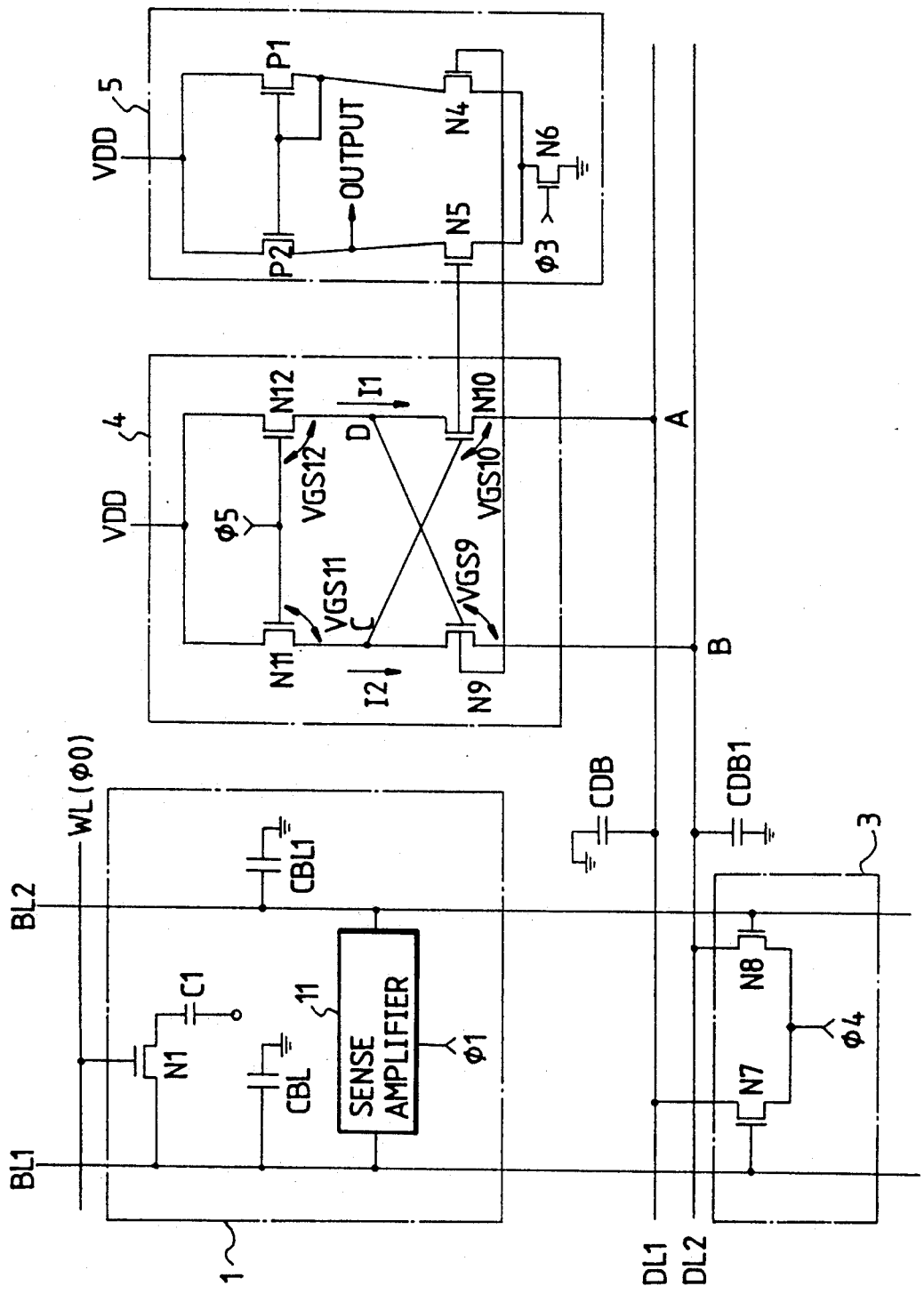
FIG. 3 is a construction diagram of the invention.

FIG. 3 is a construction diagram of this invention, and in FIG. 3, N1, N4 through N12 are n-channel MOSFET'S, P1 and P2 are p-channel MOSFET'S, 1 is a bit line sense amplifying part, 3 is a voltage difference to current difference converter, 4 is a current sensing circuit, 5 is a current difference to voltage difference converting and amplifying circuit, respectively.

As shown in FIG. 3, this invention comprises the bit line sense amplifying part, the voltage difference to current difference converter 3 for converting the voltage difference between bit lines (BL1 and BL2) to the current difference, the current sensing circuit 4 connected to the voltage difference to current difference converter 3 through the data bus lines (DL1 and DL2), the current difference to voltage difference converting and amplifying circuit 5 connected to the current sensing circuit 4, and the capacitors (CDB and CDBL) connected to the data bus lines (DL1 and DL2).

The bit line sense amplifying part 1 comprises the n channel MOSFET (N1) which the gate thereof is connected to the word line (WL), the source thereof is connected to the bit line (BL1) and the drain thereof is connected to the capacitor (C1), the capacitors (CBL and CBL1) which one terminal thereof are connected to the bit lines (BL1 and BL2) and the other terminals thereof are connected to the ground, respectively, and the bit line sense amplifier 11.

The voltage difference to current difference converter 3 comprises two n channel MOSFET's (N7 and N8) which the gates thereof are connected to the bit lines (BL1 and BL2), the drains thereof are connected to the data bus lines (DL1 and DL2) and the sources thereof are connected to an operating signal supplying line ($\phi4$), respectively.

The current sensing circuit 4 comprises two n channel MOSFET's (N11 and N12) which the power source voltage (VDD) is applied to the drains thereof and the operating signal ($\phi5$) is applied to the gates thereof, the n channel MOSFET(N9) which the drain thereof is connected to the source of the n channel MOSFET(N11), the gate thereof is connected to the source of the n channel MOSFET(N12) and the source thereof is connected to the data bus line (DL2), and the n channel MOSFET(N10) which the drain thereof is connected to the source of the n channel MOSFET(N12), the gate thereof is connected to the source of the n channel MOSFET(N11) and the source thereof is connected to the data bus line (DL1).

The current difference to voltage difference converting and amplifying circuit 5 comprises the p channel MOSFET(P1) which the gate thereof is connected to the drain thereof, the p channel MOSFET(P2) which the source and the gate thereof are connected to the source and the gate of the p channel MOSFET(Pl), respectively, and the n channel MOSFET's(N4,N5) which the drains thereof are connected respectively to the drains of the p channel MOSFET's (P1 and P2) and the gates thereof are connected respectively the gates of the n channel MOSFET's (N9,N10), and the n channel MOSFET(N6) which an operating signal ($\phi$3) is applied to the gate thereof and the drain thereof is connected to the sources of the n channel MOSFET's (N4 and N5).

A current flows to the drains of the n channel MOSFET's (N7 and N8) if a voltage difference between the bit lines (BL1 and BL2) is caused by the operating signals ($\phi$0 and $\phi$1), and then the operating signal ($\phi$4) is turned from "high" to "low" logic state. At this time, the voltages of the bit lines are applied to the gates of n channel MOSFET's (N7 and N8), respectively, and therefore the voltage difference is converted to the current difference. A current (I1) caused by the operating signal ($\phi$5) flows to the data bus line (DL1) through the n channel MOSFET's (N12 and N10), and also a current (I2) flows to the data bus line (DL2) through the n channel MOSFET's (N11 and N9). Accordingly, the gate-source voltage (VGS12) of the n channel MOSFET(N12) is the same as the gate-source voltage (VGS10), and the gate-source voltage (VGS11) of the n channel MOSFET(N11) is the same as the gate-source voltage (VGS 9) of the n channel MOSFET(N9).

If the "high" voltage(that is, VDD) is applied to the operating signal supplying line ($\phi$3), the voltage (VA) of the point A on the data line (DL1) is VDD-VGS11-VGS10, and the voltage(VB) of the point B on the data line (DL2) is VDD-VGS12-VGS9. Therefore, although the currents flowing through the data bus lines (DL1 and DL2) are different, the voltages in the data bus lines (DL1 and DL2) are still the same level at the points(A and B).

If the operating signal($\phi$3) is applied to the gate of the n channel MOSFET(N6), the current difference to voltage difference converting and amplifying circuit 5 is operated, the drain voltage of the n channel MOSFET(N9) is applied to the gate of the n channel MOSFET(N5), the drain voltage of the n channel MOSFET(N10) is applied to the gate of the n channel MOSFET(N4), and therefore the difference between two drain voltages is amplified and outputted.

What is claimed is:

1. A data sense circuit for sensing data sent through a pair of data bus lines in a semiconductor device comprising:

a work line for generating a data word line selection signal;

a pair of bit lines responsive to said data word line selection signal for producing a voltage difference between the bit lines;

said pair of data bus lines;

bit line sense amplifying means connected to said pair of bit lines and said word line;

a voltage difference to current difference converter connected to said bit line sense amplifying means through said pair of bit lines, for converting the voltage difference between said pair of bit lines into a current difference between said pair of data bus lines;

current sensing means connected to said pair of data bit lines and a power source, for sensing respective currents flowing to said pair of data bus lines whose current difference occurs in said current sensing means and for holding a same voltage level in said pair of data bus lines while said current difference occurs; and current difference to voltage difference converting and amplifying means connected to said current sensing means, for converting the current difference which occurs in said current sensing means into a converted voltage difference and then amplifying the converted voltage difference.

2. A data sense circuit according to claim 1, wherein said bit line sense amplifying means comprises a first n channel MOSFET having a gate which is connected to said word line and having a source connected to one bit line and having a drain connected to a capacitor, a pair of capacitors respectively connected to each bit line, and a bit lien sense amplifier connected to and between said pair of bit lines.

3. A data sense circuit according to claim 2, wherein said voltage difference to current difference converter comprises a second n channel MOSFET connected to one bit line and a third n channel MOSFET connected to the other bit line.

4. A data sense circuit according to claim 3, wherein said current sensing means comprises a fourth n channel MOSFET, a fifth n channel MOSFET connected to said fourth n channel MOSFET, a sixth n channel MOSFET which the drain thereof is connected to the source of said fourth n channel MOSFET and the gate thereof is connected to the source of said fifth n channel MOSFET, and a seventh n channel MOSFET which the drain thereof is connected to the source of said fifth n channel MOSFET and the gate thereof is connected to the source of said fourth n channel MOSFET.

5. A data sense circuit according to claim 4, wherein said current difference to voltage difference converting and amplifying means are connected to the drain subtracts of said sixth n channel MOSFET and said seventh n channel MOSFET.

* * * * *